(12) United States Patent
Lee et al.

(10) Patent No.: US 7,247,910 B2
(45) Date of Patent: Jul. 24, 2007

(54) MOSFET FORMED ON A SILICON-ON-INSULATOR SUBSTRATE HAVING A SOI LAYER AND METHOD OF MANUFACTURING

(75) Inventors: Jong Wook Lee, Tokyo (JP); Hisashi Takemura, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 10/499,224

(22) PCT Filed: Feb. 13, 2003

(86) PCT No.: PCT/JP03/01478

§ 371 (c)(1),
(2), (4) Date: Jun. 17, 2004

(87) PCT Pub. No.: WO03/069678

PCT Pub. Date: Aug. 21, 2003

(65) Prior Publication Data

US 2005/0098831 A1    May 12, 2005

(30) Foreign Application Priority Data

Feb. 18, 2002  (JP) .............................. 2002-039464

(51) Int. Cl.
*H01L 27/01* (2006.01)
(52) U.S. Cl. ................. 257/347; 257/E21.564
(58) Field of Classification Search ................ 257/347, 257/E21.167, E21.205, E21.564
See application file for complete search history.

(56) References Cited

U.S. PATENT DOCUMENTS

| | | | | |
|---|---|---|---|---|
| 4,782,033 A | * | 11/1988 | Gierisch et al. ............ | 438/199 |
| 5,439,836 A | * | 8/1995 | Giffard ........................ | 438/151 |
| 5,698,869 A | * | 12/1997 | Yoshimi et al. ............. | 257/192 |
| 6,037,196 A | | 3/2000 | Schwalke .................... | 438/151 |
| 6,204,137 B1 | * | 3/2001 | Teo et al. .................... | 438/305 |
| 6,287,924 B1 | * | 9/2001 | Chao et al. .................. | 438/300 |
| 6,300,172 B1 | * | 10/2001 | Ang et al. ................... | 438/149 |
| 6,365,445 B1 | * | 4/2002 | Yu .............................. | 438/149 |

FOREIGN PATENT DOCUMENTS

| | | |
|---|---|---|
| EP | 1100128 A1 | 5/2001 |
| JP | 08-213494 | 8/1996 |
| JP | 11-354465 | 12/1999 |

(Continued)

*Primary Examiner*—Thomas L. Dickey
(74) *Attorney, Agent, or Firm*—Hayes Soloway P.C.

(57) ABSTRACT

In a FET having a thin-film SOI layer, to prevent a parasitic resistance increase in source/drain regions. To realize an elevated layer to be formed on the source/drain region without using a lithography process and without a fear of a short circuit. Element-isolation insulating films 7, which are taller than a semiconductor layer 3, are formed surrounding the island-shaped semiconductor layer (SOI layer) 3, while gate electrodes 5*a*, 8*a* which are taller than the element-isolation insulating films 7 are formed on the semiconductor layer 3. A polycrystalline silicon film 11 is deposited on the whole surface. elevated layers 11*a*, 11*b* which are shorter than the element-isolation insulating film 7 are formed on the source/drain regions 3*a*, 3*b* by chemical-mechanical polishing and etching back. Silicide layers 13*a* to 13*c* are formed on the gate electrode and on the elevated layers. An interlayer insulating film 14 is formed, and a metal electrode 16 is formed.

4 Claims, 11 Drawing Sheets

FOREIGN PATENT DOCUMENTS

| | | |
|---|---|---|
| JP | 2000-183355 | 6/2000 |
| JP | 2000-223713 | 8/2000 |
| JP | 2001-015756 | 1/2001 |
| JP | 2001-024202 | 1/2001 |
| JP | 2001-332730 | 11/2001 |

* cited by examiner

1 SUPPORTING SUBSTRATE
2 BURIED INSULATING FILM
3 SEMICONDUCTOR LAYER
4 GATE INSULATING FILM
5 FIRST GATE FORMING MATERIAL LAYER
5a FIRST GATE ELECTRODE
6 SILICON NITRIDE FILM
7 ELEMENT-ISOLATION INSULATING FILM
8 SECOND GATE FORMING MATERIAL LAYER
8a SECOND GATE ELECTRODE
9 MASK INSULATING FILM
10 SIDEWALL INSULATING FILM 3a, 3b SOURCE/
DRAIN
REGION

10 SIDEWALL
INSULATING
FILM

11 POLYCRYSTALLINE
SILICON FILM 11a, 11b UPHEAVED
LAYER 13a, 13b COBALT
SILICIDE
LAYER

14 INTERLAYER
INSULATING
FILM 15a, 15b CONTACT
OPENING

16 METAL
ELECTRODE 11c 11d  UPHEAVED LAYER
13c  COBALT SILICIDE LAYER

7b ELEMENT-ISOLATION INSULATING FILM
21 SILICON OXIDE FILM

7c ELEMENT-ISOLATION INSULATING FILM
11e, 11f ELEVATED LAYER
22 GATE ELECTRODE
FIG. 12 (a) PRIOR ART
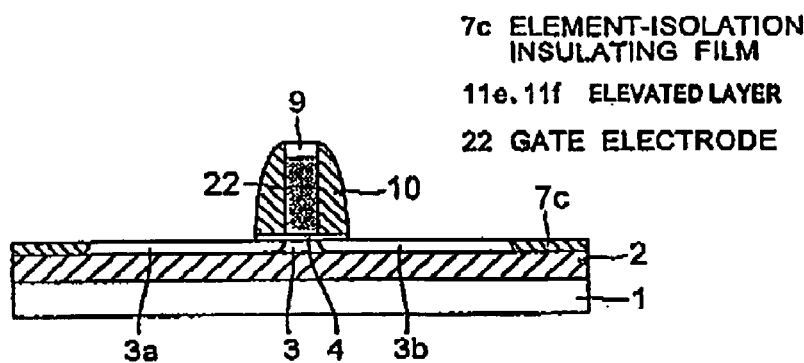
FIG. 12 (b) PRIOR ART
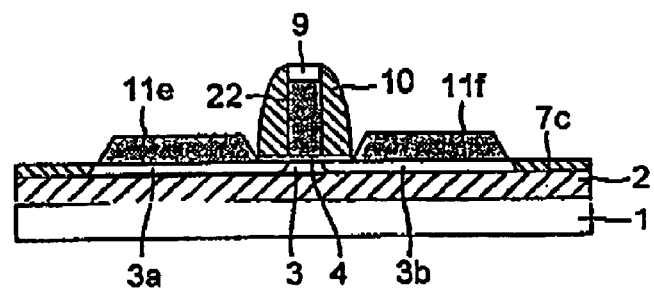
FIG. 12 (c) PRIOR ART
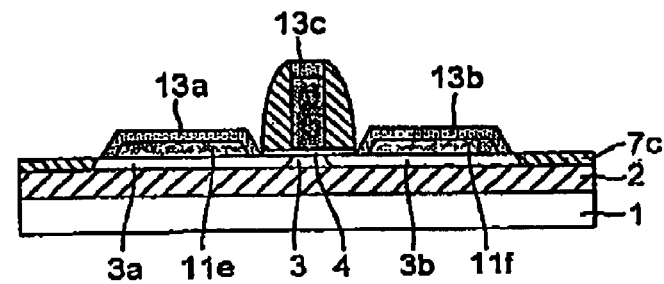
FIG. 12 (d) PRIOR ART
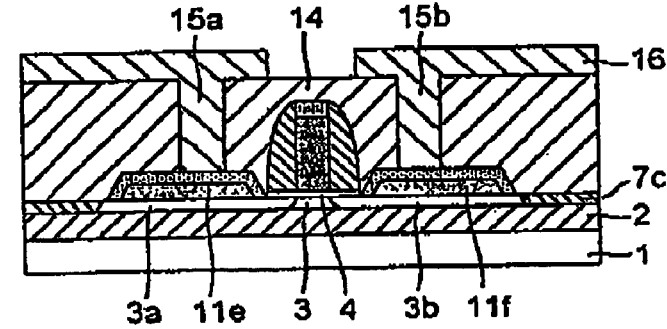

MOSFET FORMED ON A SILICON-ON-INSULATOR SUBSTRATE HAVING A SOI LAYER AND METHOD OF MANUFACTURING

TECHNICAL FIELD

The present invention relates to a semiconductor device and its manufacturing method, and in particular, to a MOSFET formed on a silicon-on-insulator (hereinafter abbreviated as SOI) substrate having an SOI layer, and its manufacturing method.

BACKGROUND ART

In a case of forming a MOSFET using an SOI substrate in which a single crystal semiconductor layer (silicon layer) is formed on a semiconductor supporting substrate via an insulating film (mainly an oxide film), the insulating film is formed under the source region and the drain region of the MOSFET, whereby it is possible to reduce the parasitic capacity comparing to a case where a MOSFET is formed using a typical bulk substrate. As such, manufacturing an LSI with a use of an SOI substrate is advantageous for a speedup of the element, so that this method has been widely adopted.

In general, MOSFETs using SOI substrates may be of a full depletion type in which an SOI layer below the gate is fully depleted to be operated, or a partial depletion type in which an SOI layer is not fully depleted but is operated with a neutral region still remaining. Although a FET of the partial depletion type has an advantage that it can be manufactured using a forming method according to a process using a bulk substrate, there remains a neutral region which is electrically separated from the substrate. Thereby, a so-called substrate floating effect arises, in which the potential of the neutral region changes corresponding to the operational conditions and the operational current fluctuates. This makes a circuit design difficult. On the other hand, in a FET of the full depletion type, the potential below the channel does not fluctuate since there is no neutral region. Therefore, it has the advantage that a stable circuit operation can be achieved.

However, transistors of the full depletion type are subject to a characteristic deterioration caused by a punch through and a short channel effect, compared to transistors of the partially depleted type. In order to counter this defect, the film thickness of the SOI layer must be made thinner. Generally, in order to keep the fully depleted operation, it is known that the film thickness of the SOI layer must be a ¼ length of the gate length or less. Therefore, if the gate length is 0.1 micron, the film thickness of the SOI layer must be 25 nm or less. However, if the film thickness of the SOI layer becomes thinner, the film thickness of the source/drain regions of the transistor becomes thinner, so that the resistance between the source/drain regions increases. In particular, if a metal silicide layer is formed on the source/drain region, the whole film thickness of the silicon layer is silicified, which causes a problem that an aggregation of silicide and breaking of wire may easily occur, whereby the parasitic resistance increases. Through our researches, we recognized that this phenomenon occurs remarkably if the film thickness of the SOI layer is 30 nm or less. In order to prevent the parasitic resistance increase, it is effective to locally thicken the silicon layer of the source/drain region. To cope with this, a method to raise a silicon layer on the source/drain region by the selective epitaxial growth has been proposed (for example, Japanese Patent Application Laid-open No. 2000-223713). This conventional art will be explained below with reference to drawings.

FIGS. 12(a) through 12(d) are sectional views showing the step of the manufacturing method, in order, of the aforementioned conventional example. There is provided an SOI substrate in which a semiconductor layer 3 is formed on a supporting substrate 1 made of silicon, via a buried insulating film 2 consisting of an oxide film. As shown in FIG. 12(a), the semiconductor layer 3 serving as an active region is isolated by element-isolation insulating films 7c, then a gate insulating film 4 is formed on the semiconductor layer 3, and a mask insulating film 9 consisting of a polycrystalline silicon film and a silicon nitride film is deposited thereon, then by patterning these, a gate electrode 22 is formed. Thereafter, sidewall insulating films 10 are formed on the side surfaces of the gate electrode 22 having the mask insulating film 9.

Next, as shown in FIG. 12(b), single crystal silicon is raised to have, for example, a film thickness of 50 nm under the silicon growth CVD conditions including HCl, to thereby form elevated layers 11e, 11f. Then, by implanting into the semiconductor layer 3, using the ion implanting method, impurity atoms of a conductive type opposite to that of the semiconductor layer serving as a channel region, source/drain regions 3a, 3b are formed.

Next, as shown in FIG. 12(c), after the mask insulation film 9 is removed, cobalt, for example, is deposited on the whole surface by spattering to have a film thickness of 30 nm to 100 nm, and a heat treatment is performed to thereby form cobalt silicide layers 13a, 13b and 13c. Then, the extra cobalt silicide layer is etched away, but with the cobalt silicide layers 13a, 13b and 13c remaining.

Then, as shown in FIG. 12(d), an interlayer insulating film 14 consisting of an oxide film or the like is deposited on the cobalt silicide layers 13a, 13b and 13c by the CVD. Here, the surface of the interlayer insulating film 14 may be flattened by the chemical-mechanical polishing (CMP). Then, contact openings 15a, 15b are selectively formed in the interlayer insulating film 14. Then, a metal such as Al is deposited by spattering, and is patterned by the photolithography to thereby form a metal electrode 16 contacting the cobalt silicide layers 13a, 13b and 13c via the contact openings 15a, 15b.

In a method of forming the elevated layers using the aforementioned selective epitaxial growth method, facets are generated at the growth edges of the elevated layers, which causes the width of the growth edges to narrow. As such, it is difficult to form elevated layers with low resistance. Further, the selective epitaxial growth needs a special CVD device suitable for the method, which causes the manufacturing cost to increase.

Further, in a case that silicon is raised under the condition that the facets are not formed at the growth edges of the elevated layers, selectivity is degraded, whereby a special lithography process is required to prevent a short circuit. As a method of forming the elevated layers in which selective growth is not performed and the lithography process is not required, there is proposed a method in which element-isolation insulating films are so formed as to be taller than the semiconductor layer (SOI layer), and by using CVD, CMP and the like, a conductive material such as silicon is buried into a depression defined by the gate electrode and the element-isolation insulating films.

In this case, however, the surface height of the gate electrode and the surface height of the elevated layer coincide with each other, which causes a problem that a short circuit tends to occur when a silicide layer is formed.

It is an object of the present invention to solve the aforementioned problems in the conventional art, which object includes, first, to enable elevated layers with low resistance to be formed to thereby reduce the parasitic resistance in source/drain regions, and secondly, to enable elevated layers which are less possible to cause a short circuit to be formed without using a lithography process.

SUMMARY OF THE INVENTION

In order to achieve the aforementioned object, a semiconductor device according to the present invention comprises: a semiconductor layer which is formed on an insulating film or on an insulating substrate while being surrounded by element-isolation insulating films, and includes a channel region and a source/drain region; a gate electrode which is formed on the channel region via a gate insulating film while being surrounded by sidewall insulating films; and an elevated layer which is made of a conductive material and is formed on the source/drain region. The semiconductor device has such a structure that the surface height of the gate electrode formed to be surrounded by the sidewall insulating films is higher than the surface height of the element-isolation insulating films, and the surface height of the elevated layer is equal to or lower than the surface height of the element-isolation insulating films.

The elevated layer is preferably made of a polycrystalline silicon film, or a polycrystalline silicon film and a metal silicide film formed thereon, or a polycrystalline silicon film and a metal film formed thereon, or a metal silicide film, or a metal film.

Further, a method of manufacturing the semiconductor device according to the present invention comprises the steps of:

(1) forming, on an insulating film or on an insulating substrate, element-isolation insulating films which surround a semiconductor layer serving as a channel region and a source/drain region and have a film thickness thicker than that of the semiconductor layer;

(2) forming, on the semiconductor layer via a gate insulating film, a gate electrode, the surface height of which is higher than the surface height of the element-isolation insulating films; and (3) selectively forming, on the semiconductor layer, conductive elevated layers, which are surrounded by the element-isolation insulating films and the gate electrode, and the surface height of which is lower than the surface height of the element-isolation insulating films.

Further, the method of manufacturing the semiconductor device according to the present invention may have such a structure including the steps of:

(1) depositing a first gate forming material layer and a mask material layer via a gate insulating film on a semiconductor layer formed on an insulating film or on an insulating substrate;

(2) patterning the mask material layer, the first gate forming material layer and the semiconductor layer so as to be island shaped, and filling element-isolation grooves formed with element-isolation insulating films;

(3) patterning the mask material layer and the first gate forming material layer to thereby form a first gate electrode;

(4) forming first sidewall insulating films on the side surfaces of the element-isolation insulating films and on the side surfaces of a laminated body formed of the mask material layer and the first gate electrode;

(5) filling depressions surrounded by the first sidewall insulating films on the semiconductor layer with conductive elevated layers and sacrifice fillers; and (6) after removing the mask material layer, depositing a second gate forming material layer and patterning it to thereby form a second gate electrode.

BRIEF DESCRIPTION OF THE DRAWINGS

FIGS. 12(a)-12(d) are sectional views showing a conventional example in the order of steps.

DESCRIPTION OF THE PREFERRED EMBODIMENTS

Figure 1:
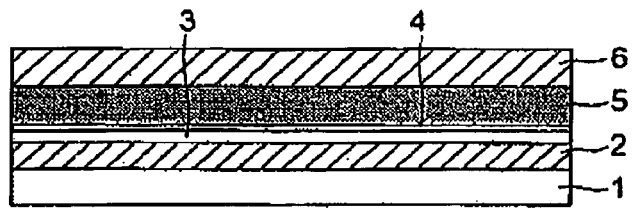
FIGS. 1(a)-1(e) are sectional views showing a first embodiment of the present invention in the order of steps
Figure 1:
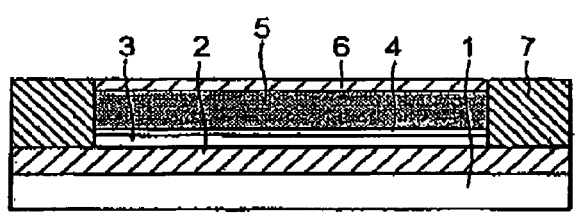
Figure 1:
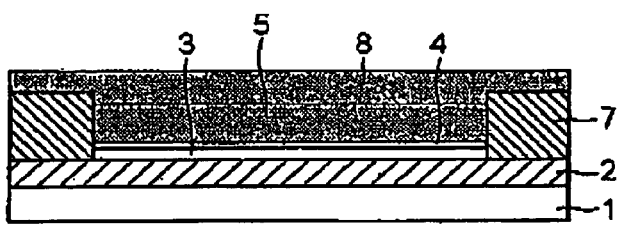
Figure 1:
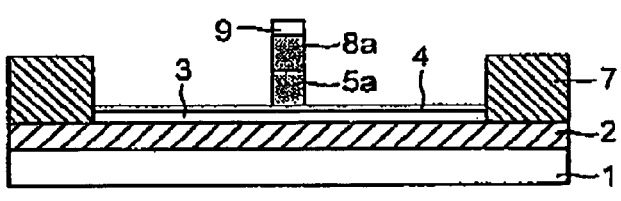
Figure 1:
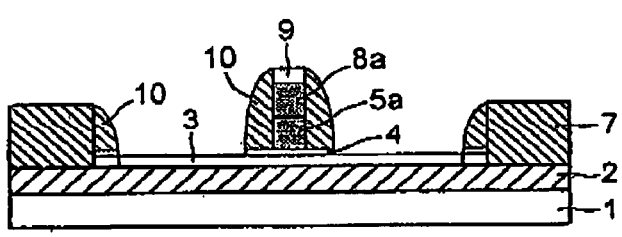
Figure 2:
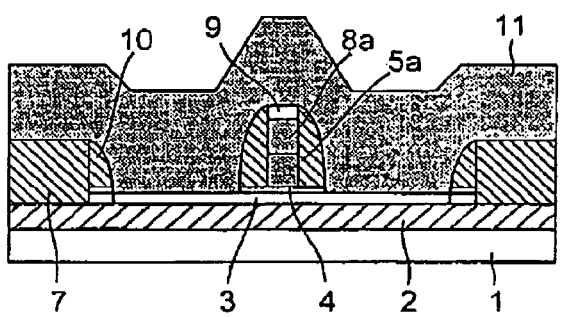
FIGS. 2(a)-2(d) are sectional views showing the first embodiment of the present invention in the order of steps.
Figure 2:
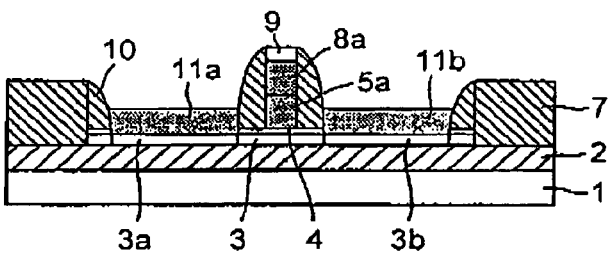
Figure 2:
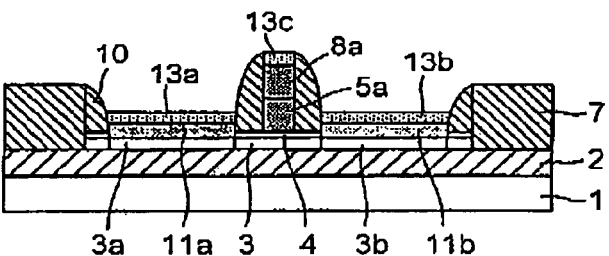
Figure 2:
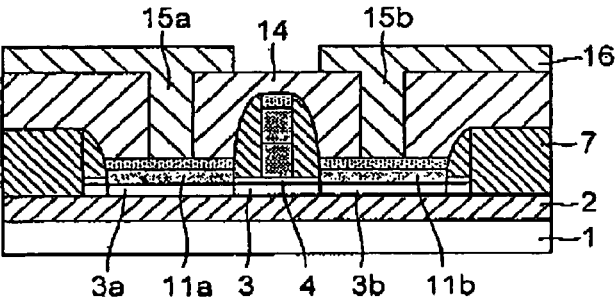

Next, modes of carrying out the present invention will be described in detail in line with embodiments with reference to the drawings.

First Embodiment

FIGS. 1(a) through 1(e) and FIGS. 2(a) through 2(d) are schematic sectional views showing the steps of a manufacturing method of a semiconductor device, in order, according to a first embodiment of the present invention. In FIGS. 1 and 2, the dimensions in the vertical direction (up and down direction of the Figs.) are shown to be enlarged.

As shown in FIG. 1(a), first there is provided an SOI substrate in which, on a supporting substrate 1 made of silicon or the like, a buried insulating film 2 consisting of an oxide film with a thickness of 100 nm is formed, then on the insulating film 2, a semiconductor layer 3 made of silicon or the like is formed to have a film thickness of 5 nm to 60 nm. As a substitute for such an SOI substrate, an SOI substrate formed by an SIMOX (Separated by Implanted Oxygen) method in which oxygen is ion-implanted into a silicon supporting substrate, or an SOI substrate formed by laminating, may be used. Further, an SOI substrate in which a semiconductor layer is provided on an insulating substrate, such as an SOS (Silicon on Sapphire), may also be used.

Next, a channel region is formed by implanting impurity atoms in the semiconductor layer 3 using, for example, the ion implanting. Here, the concentration of the impurity atoms is set to be an impurity concentration appropriate for forming the channel region.

Next, on the semiconductor layer 3, a gate insulating film 4 with about 10 nm film thickness is formed by, for example, a thermal oxidation, and then on the gate insulating film 4, polycrystalline silicon, for example, is deposited to have a film thickness of about 50 nm so as to form a first gate material layer 5, and further a silicon nitride film 6 is formed to have about 100 nm thickness on the first gate material layer 5.

Next, as shown in FIG. 1(b), the semiconductor layer 3 serving as an element region, the gate insulating film 4, the first gate material layer 5 and the silicon nitride film 6 are processed to be island shaped by anisotropic etching.

Then, an insulating film 7 such as an oxide film is deposited to have about 200 nm film thickness on the whole surface by a deposition method such as the CVD. Then, by chemical-mechanical polishing (CMP), the insulating film 7 and a portion of the silicon nitride film 6 serving as a stopper film for the CMP are polished and flattened, to thereby form element-isolation insulating films 7 surrounding the island-shaped semiconductor layer 3. Thereby, the element-isolation insulating films 7 can be formed to have a structure raised above the semiconductor layer 3.

Next, as shown in FIG. 1(c), the silicon nitride film 6 is selectively etched away using phosphoric acid or the like. Then, on the first gate material layer 5, a second gate material layer 8 consisting of a polycrystalline silicon film is deposited to have about 100 nm film thickness by the CVD.

Next, as shown in FIG. 1(d), after a mask insulating film 9 consisting of a silicon nitride film or the like is deposited to have about 20 nm film thickness on the whole surface, the mask insulating film 9, the second gate material layer 8 and the first gate material layer 5 are etched in the order using a resist or the like as a mask, whereby a first gate electrode 5a and a second gate electrode 8a are formed.

Thereafter, by depositing an oxide film using the CVD to have a film thickness of, for example, 150 nm and continuing anisotropic etching, sidewall insulating films 10 are formed on the sidewalls of the laminated structure consisting of the mask insulating film 9, the second gate electrode 8a and the first gate electrode 5a, and on the sidewalls of the element-isolation insulating films 7, respectively. After this step has been completed, the exposed gate insulating film 4 is removed by etching. Note that prior to the sidewall insulating films 10 being formed, a halo region may be formed by implanting into the semiconductor layer 3 impurity atoms of a conductive type same as that of the channel region, or a source/drain extension region may be formed by implanting into the semiconductor layer 3 impurity atoms of a conductive type opposite to that of the channel region.

Next, as shown in FIG. 2(a), a polycrystalline silicon film 11 is deposited by the CVD to have about 300 nm film thickness on the whole surface.

Then, as shown in FIG. 2(b), the polycrystalline silicon film 11 is flattened by chemical-mechanical polishing, and then etched away so as to be in a height position lower than the surface height position of the element-isolation insulating films. Thereby, elevated layers 11a and 11b consisting of the polycrystalline silicon film 11 are formed in depressions surrounded by the element-isolation insulating films 7 and the laminated structure including the gate electrodes 5a and 8a, as shown in the Fig.

As described above, it is processed in such a manner that the polycrystalline silicon film 11 is deposited in the depressions, and the surface of the polycrystalline silicon film 11 is polished and flattened by the CMP, then the polycrystalline silicon film 11 is removed by etching so as to have the required film thickness, whereby the elevated layers 11a and 11b are formed. Therefore, the film thickness of the elevated layers 11a, 11b can be uniform utilizing the characteristics of the etching. Further, since the film thickness of the elevated layers 11a, 11b can be uniform, facets 11d, shown in FIG. 12(b) showing the conventional example, are not formed on the elevated layers 11a, 11b, whereby the polycrystalline silicon film 11 is filled in the portions which have been the facets 11d conventionally. This enables resistance between a metal electrode 16 in the contact openings, described later, and the region of the semiconductor layer 3 to be reduced. It is also possible to further suppress an increase in the resistance by setting the thickness of the elevated region to 30 nm or more.

Next, impurity atoms of a conductive type opposite to that of the channel are implanted by ion implanting into the second gate electrode 8a, the first gate electrode 5a and the elevated layers 11a, 11b, and by performing a heat treatment, for example, at 1000° C. for 10 seconds, a conductivity is given to the polycrystalline silicon film while source/drain regions 3a, 3b of the opposite conductive type are formed in the semiconductor layer 3.

Next, as shown in FIG. 2(c), after the mask insulating film 9 on the gate electrode 8a is removed (the mask insulating film 9 may be removed prior to the ion implanting process), cobalt, for example, is deposited by spattering on the whole surface to have a film thickness of 30 nm to 100 nm, and a heat treatment is performed, whereby cobalt silicide layers 13a, 13b and 13c are formed.

Then, the extra cobalt is etched away, whereby the cobalt silicide layers 13a, 13b and 13c are selectively remained. Here, the top surfaces of the elevated layers 11a, 11b and the top surface of the gate electrodes (5a, 8a) have a difference in their heights, and a depression is formed on the gate electrode 8a where the mask insulating film 9 is removed. Thereby, a short circuit between the elevated layers 11a, 11b and the gate electrodes (8a, 5a) is prevented.

Then, as shown in FIG. 2(d), an interlayer insulating film 14 consisting of an oxide layer or the like is deposited on the whole surface by the CVD, and the surface of the interlayer insulating film 14 is flattened by chemical-mechanical polishing, if necessary. Then, by selectively etching away the interlayer insulating film 14, contact openings 15a, 15b are formed (a contact opening 15c on the silicide layer 13c is not shown).

Then, a metal electrode 16, contacting the silicide layers 13a, 13b and 13c via the contact openings, is formed by depositing a metal film and patterning by the photolithography.

Figure 3:
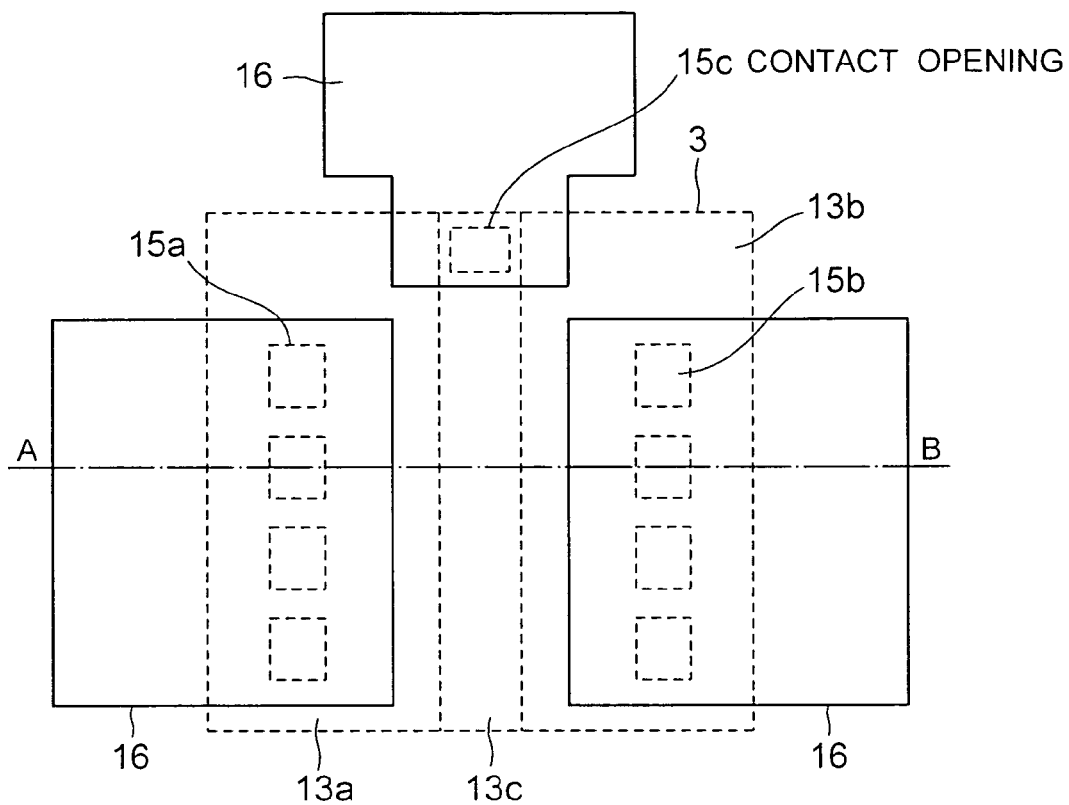
FIG. 3 is a plan view showing the first embodiment of the present invention.

FIG. 3 is a plan view showing the first embodiment of the present invention, and a sectional view taken along the line III-III in FIG. 3 is shown in FIG. 2(d).

As described above, the depressions are formed by such a structure that the element-isolation insulating films 7 are raised above the semiconductor layer 3, and the sidewalls of the element-isolation insulating films 7 and the gate electrodes 5a, 8a are covered with the sidewall insulating films 10, respectively. Further, the elevated layers 11a, 11b can be formed to be buried in a self-aligned manner on the source/drain regions 3a, 3b in the depressions by the film deposition using the CDV and by flattening and etching using the CMP. Therefore, in the present invention, it is not required to use a selective epitaxial growth like the conventional method, nor specific processing. Further, facets, which cause a problem in the selective epitaxial growth method, will never be generated principally. Thus, this structure provides an advantage that the resistance can be reduced in a full scale. Further, since the element-isolation insulating films 7 are raised above the semiconductor layer 3, patterning by a photoresist or the like required in the structure where it is not raised is not necessary, whereby the steps can be simplified. Moreover, as shown in FIG. 3, the positions of the source/drain regions 3a, 3b and the elevated layers 11a, 11b are not deviated and the margin between the adjacent regions can be shortened, so that there is an advantage of being miniaturized. Further, by making the surface height of the gate electrodes 5a, 8a higher than the surface height of the elevated layers 11a, 11b, and by forming silicide in the depression surrounded by the sidewall insulating films 10 on the gate electrodes 5a, 8a, it is possible to effectively prevent a short circuit between the gate electrodes 5a, 8a and the source/drain regions 3a, 3b without expanding the area (without sacrificing the integration degree).

As described above, in the semiconductor device of the present invention, even in the case of using an SOI substrate in which the film thickness of the semiconductor layer 3 is 30 nm or less whereby the parasitic resistance of the source/drain regions 3a, 3b increases, the elevated layers 11a, 11b can be formed to have any film thickness in a self-aligned manner, whereby it is possible to reduce the resistant value of the parasitic resistance in the source/drain regions 3a, 3b.

Second Embodiment

Figure 4:
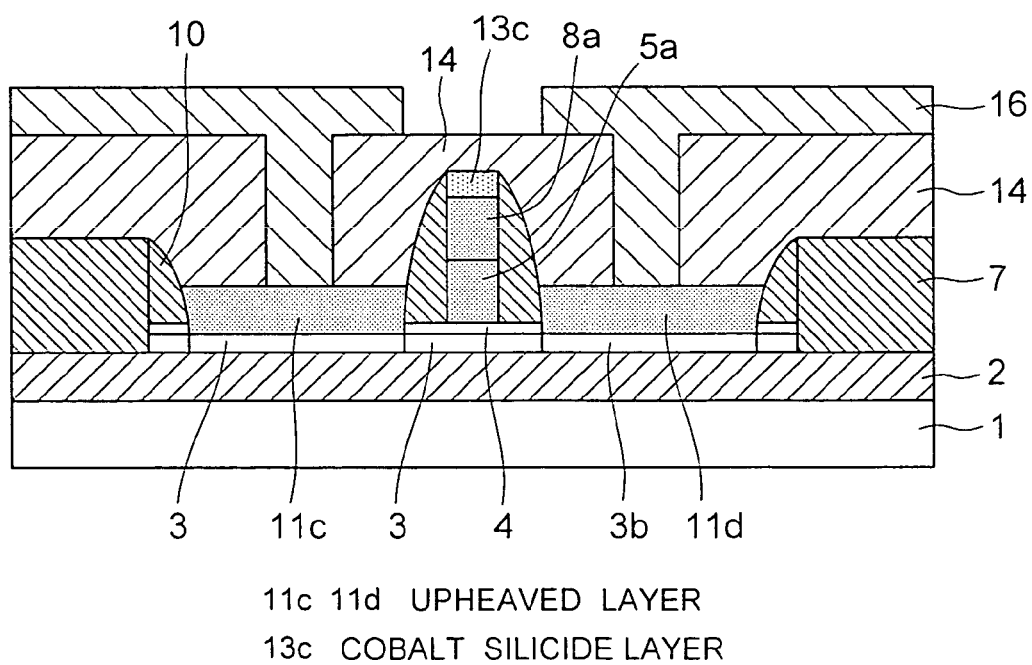
FIG. 4 is a sectional view showing a second embodiment of the present invention.
Figure 5:
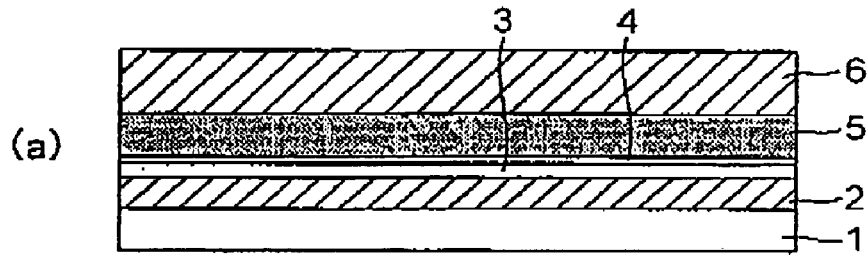
FIGS. 5(a)-5(e) are sectional views showing a third embodiment of the present invention in the order of steps.
Figure 5:
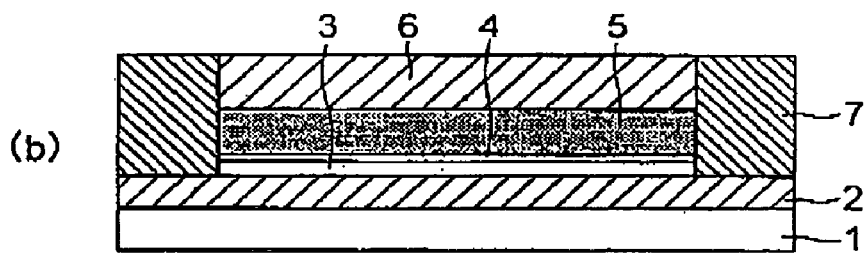
Figure 5:
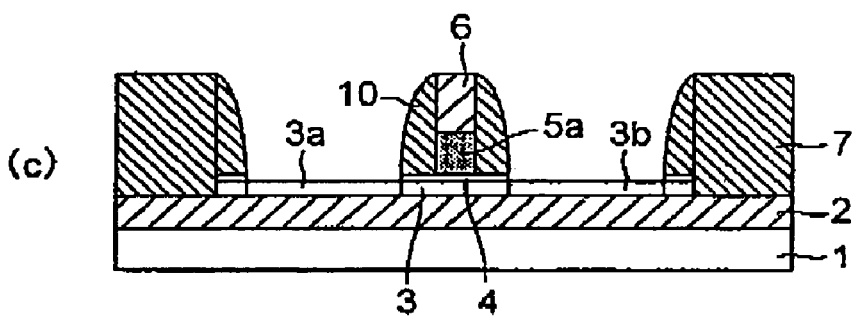
Figure 5:
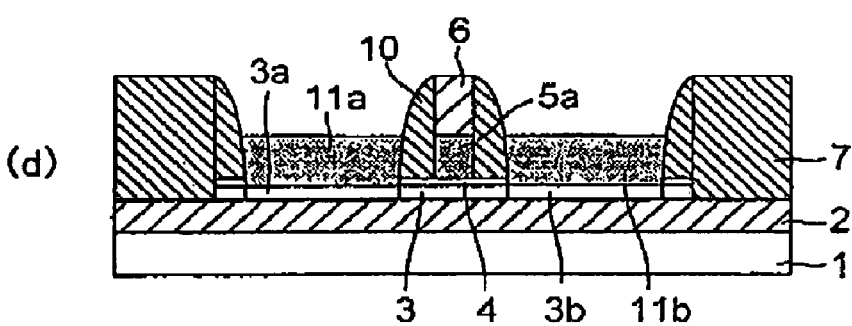
Figure 5:
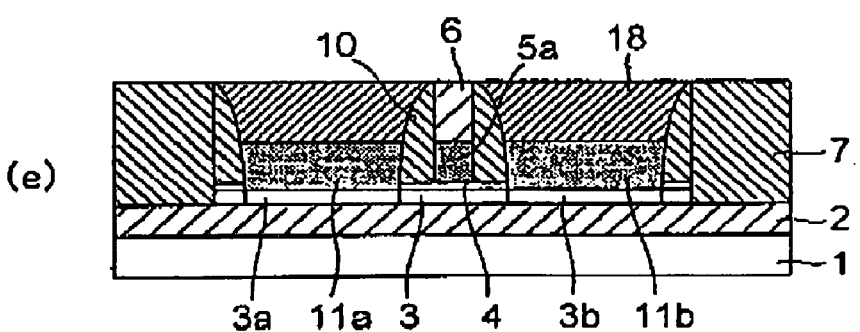
Figure 6:
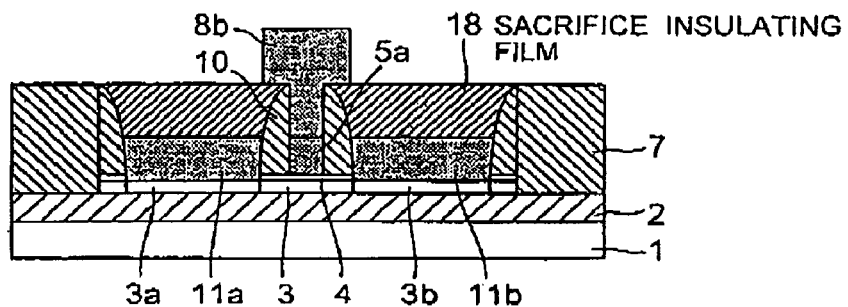
FIGS. 6(a)-6(d) are sectional views showing the third embodiment of the present invention in the order of steps.
Figure 6:
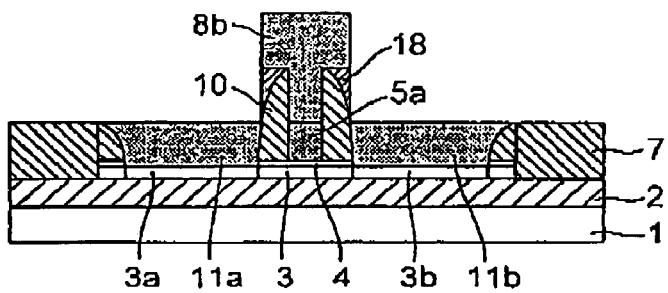
Figure 6:
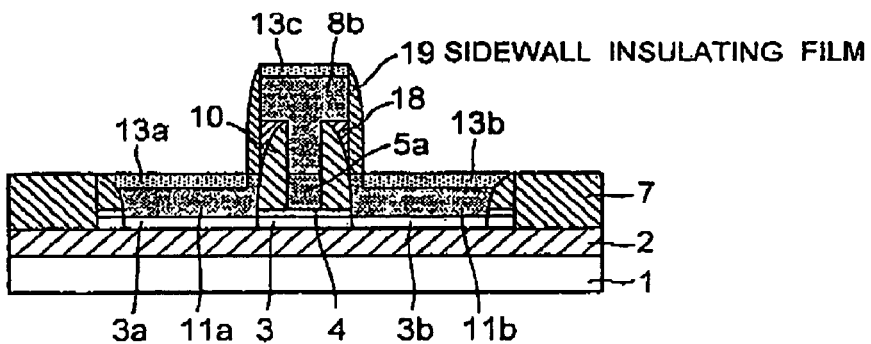
Figure 6:
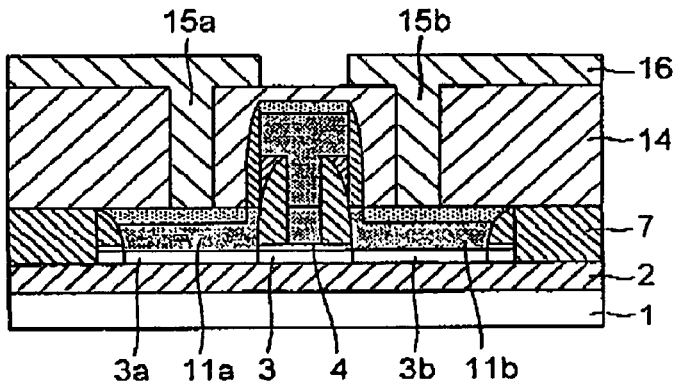

FIG. 4 is a sectional view showing a second embodiment of the present invention. In FIG. 4, the dimension in the vertical direction (up and down direction in the Fig.) is shown to be enlarged.

A semiconductor device according to the second embodiment shown in FIG. 4 includes, a buried insulating film 2 formed on a supporting substrate 1, a semiconductor layer 3 consisting of a silicon film, source/drain regions 3a, 3b formed in a portion thereof, element-isolation insulating films 7 surrounding the semiconductor layer 3, a gate insulating film 4 formed on the semiconductor layer 3, a first gate electrode 5a and a second gate electrode 8a, sidewall insulating films 10 formed on the sidewalls of the gate electrodes, elevated layers 11c, 11d consisting of a metal silicide film formed to be buried in depressions surrounded by the element-isolation insulating films 7 (and the sidewall insulating films 10 thereof) and by the gate electrodes (and the sidewall insulating films 10 thereof), an interlayer insulating film 14 which covers the whole surface, and a metal electrode 16 which is formed on the interlayer insulating film 14 so as to contact the elevated layers 11c, 11d via contact openings provided in the interlayer insulating film 14.

Although the elevated layers 11a, 11b in the first embodiment consist of a polycrystalline silicon film, the elevated layers 11a, 11b in the second embodiment consist of a metal silicide films.

In the embodiment shown in FIG. 4, the elevated layers 11a, 11b do not consist of a silicon layer but consist of a metal silicide layer, which enables to realize the elevated layers 11a, 11b with lower resistance. The elevated layers 11a, 11b may consist of a metal silicide layer such as cobalt silicide, tungsten silicide, molybdenum silicide, and titanium silicide. Instead of these metal silicide layers, the elevated layers 11a, 11b may consist of a metal film such as a tungsten film which is formed via a barrier film such as a tungsten film or a titanium nitride film. By forming the elevated layers 11a, 11b using a metal film in this way, it is possible to further reduce the resistance of the elevated layers.

The elevated layers 11a, 11b consisting of a metal silicide or a metal film as described above, can be easily formed by depositing the metal silicide or the metal films in the depressions and flattening them by the CMP, and etching.

In this way, in the present invention, the elevated layers 11a, 11b can be formed without utilizing a lithography technique even if metal silicide films or metal films, which have less selectivity than silicon films and are difficult in selective growth, are used.

Further, the elevated layers 11a, 11b may be formed by depositing an amorphous silicon film and making it into polycrystalline by a heat treatment. By performing a heat treatment to the amorphous film, it is possible to form a silicon layer with a large grain size. This enables the elevated layers 11 to have lower resistance than those being formed by depositing a polycrystalline silicon film.

Third Embodiment

FIGS. 5(a) through 5(e) and FIGS. 6(a) through 6(d) are schematic sectional views showing the manufacturing method in the order of steps of a semiconductor device according to a third embodiment of the present invention. In FIGS. 5 and 6, the dimensions in the vertical direction (up and down direction in Figs.) are shown to be enlarged.

First, as shown in FIG. 5(a), there is provided an SOI substrate which is so formed that on a supporting substrate 1 consisting of silicon or the like, a buried insulating film 2 consisting of, for example, an oxide film having a film thickness of 100 nm and a semiconductor layer 3 having a film thickness of 5 nm to 60 nm consisting of silicon or the like are laminated.

Next, impurity atoms of a first conductive type are implanted into the semiconductor layer by, for example, the ion implanting so as to be in a concentration appropriate for forming a channel region. Then, on the semiconductor layer 3, a gate oxide layer with about 10 nm film thickness is formed by, for example, a thermal oxidation, and on the layer, a first gate material layer 5 consisting of polycrystalline silicon or the like is formed to have about 50 nm film thickness and further a silicon nitride film 6 is formed to have about 200 nm film thickness, respectively.

Next, as shown in FIG. 5(b), the silicon nitride film 6, the first gate material layer 5, the gate insulating film 4 and the semiconductor layer 3 are anisotropically etched to be island shaped. Then, an insulating film (7) such as an oxide film is deposited on the whole surface by a depositing method such as the CVD to have a film thickness of about 300 nm. Then, by chemical-mechanical polishing, the insulating film (7) and a portion of the silicon nitride film 6 serving as a stopper film for the chemical-mechanical polishing are polished and flattened to thereby form element-isolation insulating films 7 surrounding the semiconductor layer 3 in the element region. Thereby, the element-isolation insulating films 7 are configured to be raised above the semiconductor layer 3.

Next, as shown in FIG. 5(c), a resist film (not shown) serving as a mask is formed by a typical photolithography on the region for forming the gate electrode, and the silicon nitride film 6 and the first gate material layer 5 are anisotropically etched to thereby form a first gate electrode 5a which includes the silicon nitride film 6 on the surface thereof.

Next, after the resist film is removed, the silicon oxide film is deposited by the CVD to have a film thickness of, for example, 150 nm, and then anisotropically etched, whereby sidewall insulating films 10 are formed on the sidewalls of the gate electrode 5a and the silicon nitride film 6 and on the inner sidewalls of the element-isolation insulating films 7, respectively. During this process, a portion of the gate insulating film 4 is etched and a portion serving as a source/drain region of the semiconductor layer 3 is exposed. Note that before the sidewall insulating films 10 are formed, a halo region may be formed by implanting into the semiconductor layer 3 impurity atoms of a conductive type same as that of the channel region, or a source/drain extension region may be formed by implanting into the semiconductor layer 3 impurity atoms of a conductive type opposite to that of the channel region.

Next, as shown in FIG. 5(d), in depressions defined by the sidewall insulating films 10 on the element-isolation insulating films 7 and by the sidewall insulating films 10 on the silicon nitride film 6 and the gate electrode 5a, a polycrystalline silicon film (11) is deposited by the CVD to have a film thickness of about 300 nm, and is flattened by chemical-mechanical polishing, then the polycrystalline silicon film is etched to thereby form elevated layers 11a and 11b consisting of the polycrystalline silicon film in the depressions surrounded by the element-isolation insulating films 7 and the gate electrode 5a as shown in the Fig.

In this way, since the element-isolation insulating films 7 are raised above the semiconductor layer 3 so as to form the dented structure, not only the element-isolation insulating films 7 raised serves as the stopper for the CMP in the process of performing the CMP to the polycrystalline silicon film, but also the film thickness of the elevated layers 11a, 11b can be formed to be uniform due to the dented structure. Further, by setting the thickness of the elevated layers 11a, 11b to be 30 nm or more, it is possible to suppress an increase in the resistance. The reason is the same as that described in the first embodiment.

Next, impurity atoms of a conductive type opposite to that of the channel are implanted into the elevated layers 11a, 11b by ion implanting, and by performing a heat treatment at, for example, 1000° C. for 10 seconds, source/drain regions 3a and 3b are formed in the region of the semiconductor layer 3.

Next, as shown in FIG. 5(e), on the whole surface, an insulating film (18) consisting of, for example, an oxide film is deposited on the whole surface by the CVD and is processed by the CMP so as to be selectively remained on the elevated layers 11a, 11b to thereby form a sacrifice insulating film 18.

Next, as shown in FIG. 6(a), the silicon nitride film 6 on the gate electrode 5a is selectively etched away using phosphoric acid or the like, and a polycrystalline silicon film is deposited on the whole surface by the CVD and is given a conductivity by ion implanting, then the polycrystalline silicon film is patterned to thereby form a second gate electrode 8b contacting the first gate electrode 5a.

Next, as shown in FIG. 6(b), using the second gate electrode 8b as a mask (the resist used for forming the second gate electrode 8b may be used as a mask), the sacrifice insulating film 18 is anisotropically etched away to thereby cause the surfaces of the elevated layers 11a, 11b to be exposed.

Next, as shown in FIG. 6(c), a silicon oxide film, for example, is deposited to have about a film thickness of 50 nm and is anisotropically etched, to thereby form sidewall insulating films 19 on the sidewall regions of the gate electrodes 5a and 8a.

Next, cobalt, for example, is deposited on the whole surface with a film thickness of about 30 nm to 100 nm by spattering, to thereby form cobalt silicide layers 13a, 13b and 13c. Then, the extra cobalt is etched away, so that the cobalt silicide layers 13a, 13b and 13c are selectively remained.

Next, as shown in FIG. 6(d), an interlayer insulating film 14 and a metal electrode 16 are formed by a method same as that described in the first embodiment, then the manufacturing step of the semiconductor device according to the present embodiment is completed.

Figure 7:
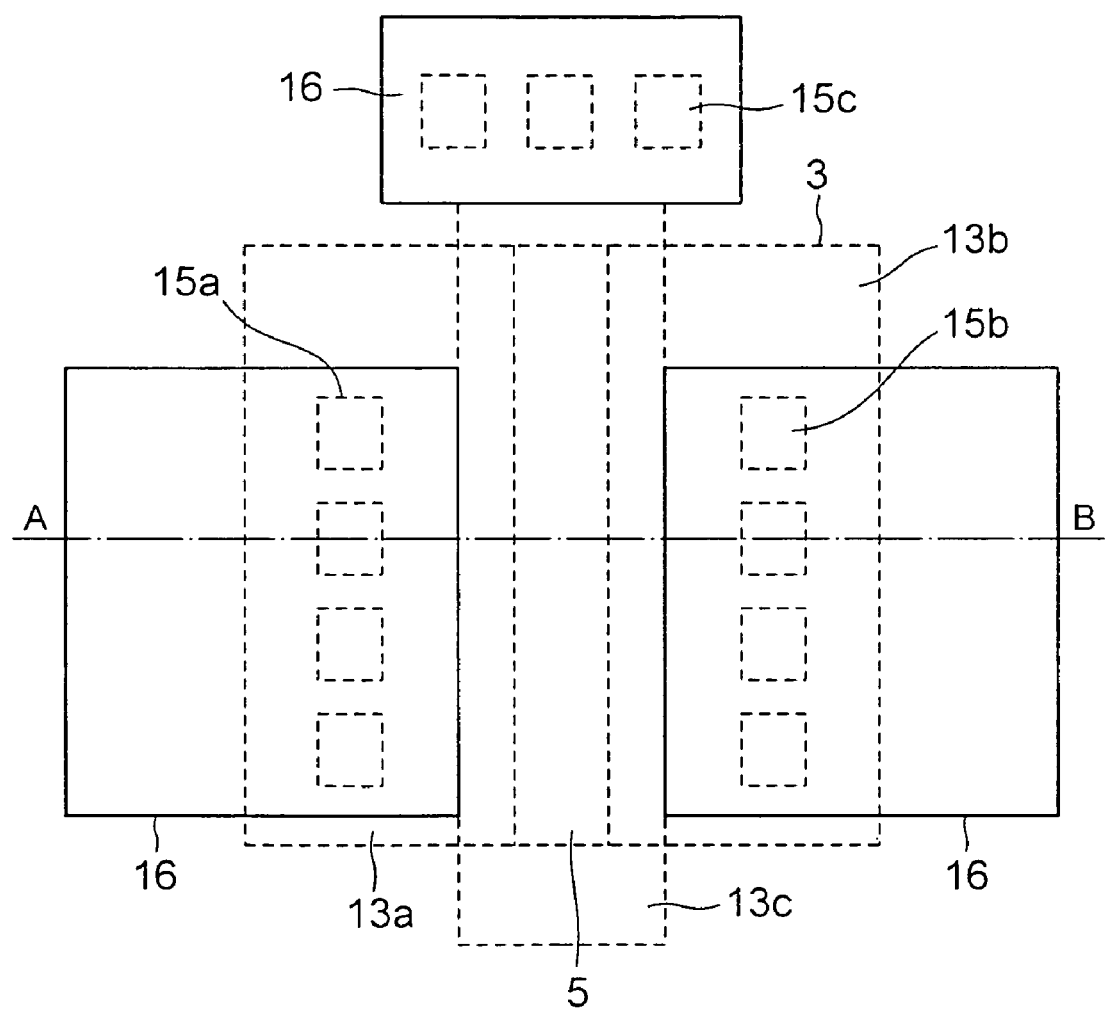
FIG. 7 is a plan view showing the third embodiment of the present invention.
Figure 8:
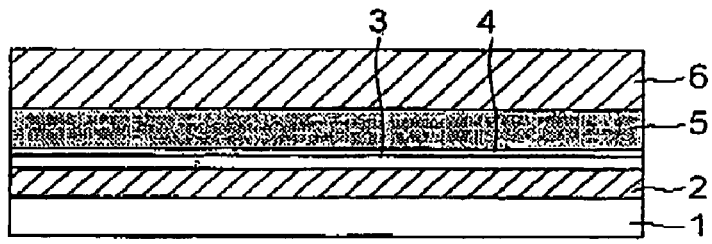
FIGS. 8(a)-8(e) are sectional views showing a fourth embodiment of the present invention in the order of steps, and FIGS. 9(a-9(d) are sectional views showing the fourth embodiment of the present invention in the order of steps.
Figure 8:
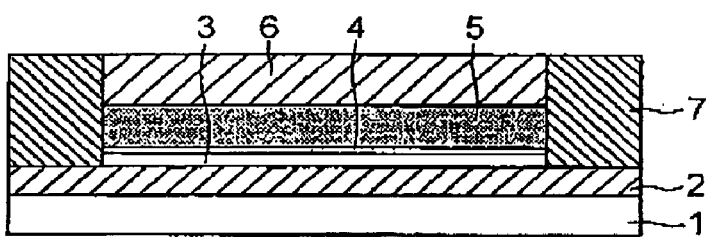
Figure 8:
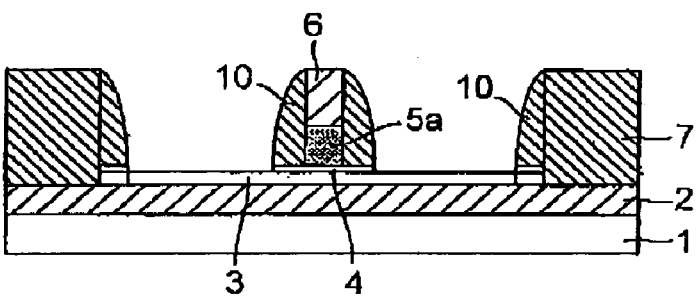
Figure 8:
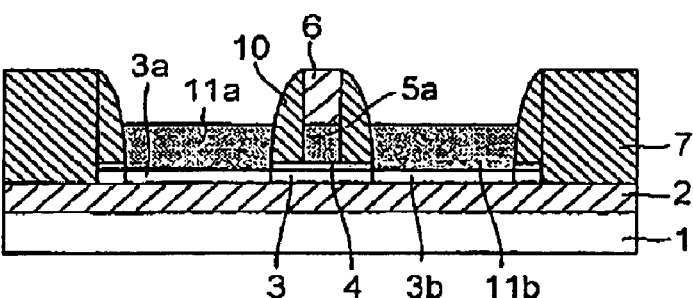
Figure 8:
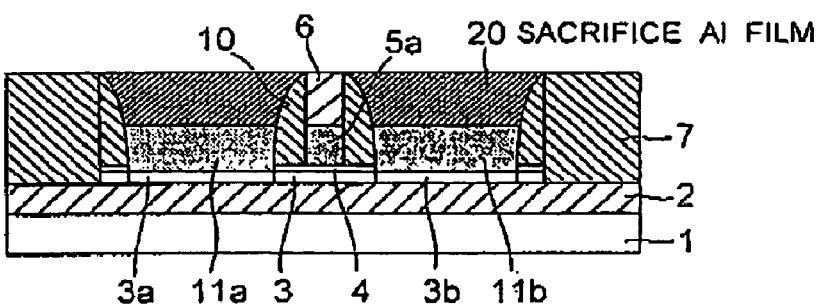
Figure 9:
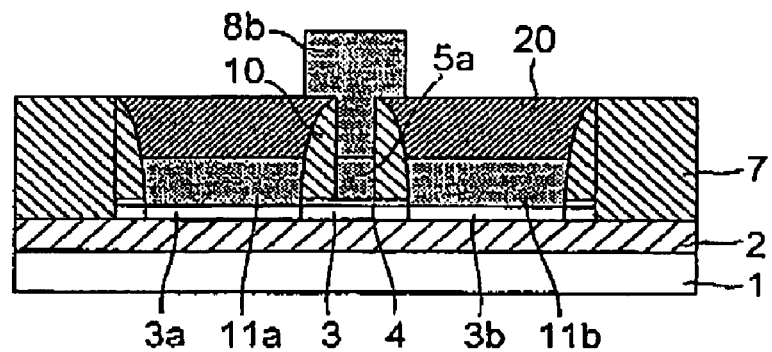
Figure 9:
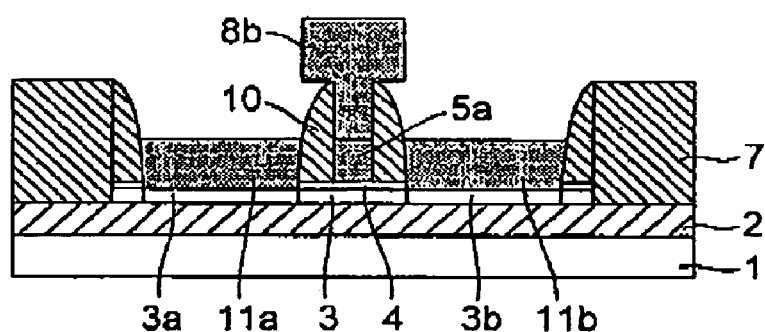
Figure 9:
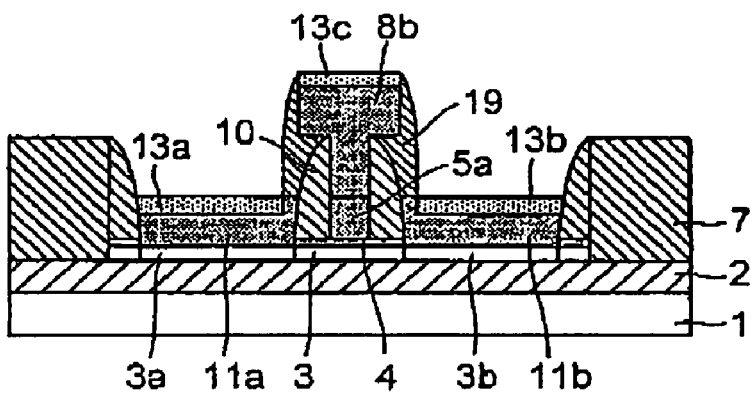
Figure 9:
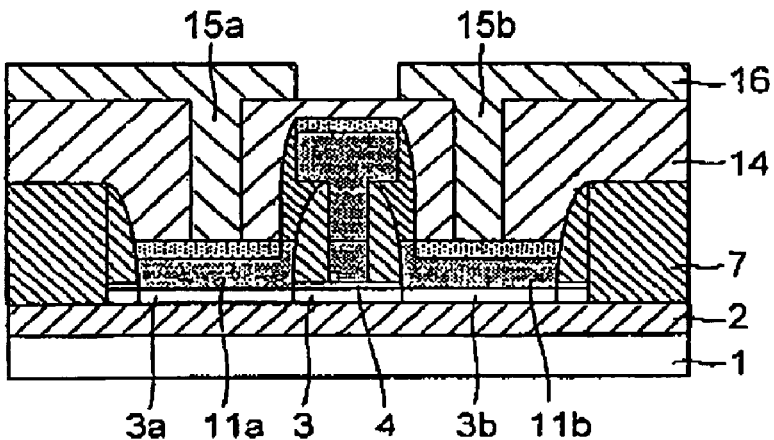
Figure 10:
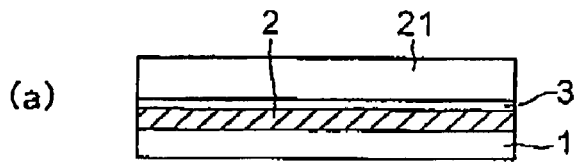
FIGS. 10(a)-10(f) are sectional views showing a fifth embodiment of the present invention in the order of steps.
Figure 10:
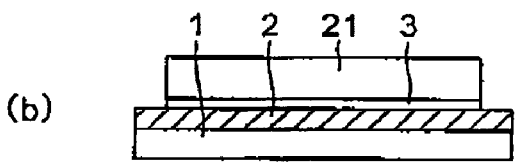
Figure 10:
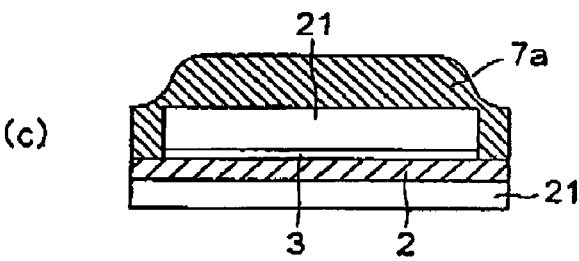
Figure 10:
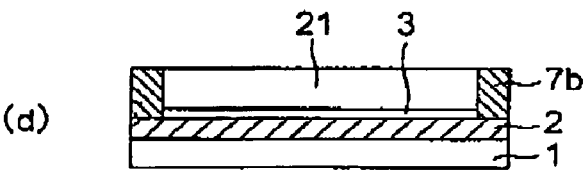
Figure 10:
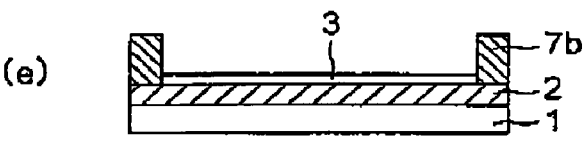
Figure 10:
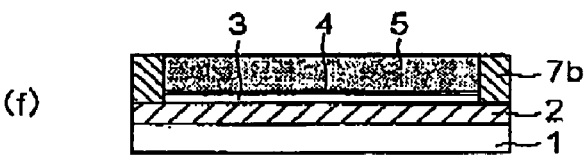
Figure 11:
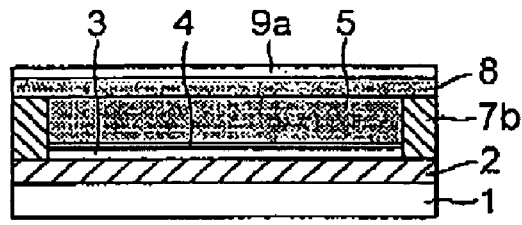
FIGS. 11(a)-11(f) are sectional views showing the fifth embodiment of the present invention in the order of steps.
Figure 11:
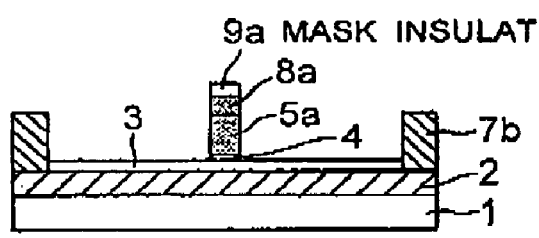
Figure 11:
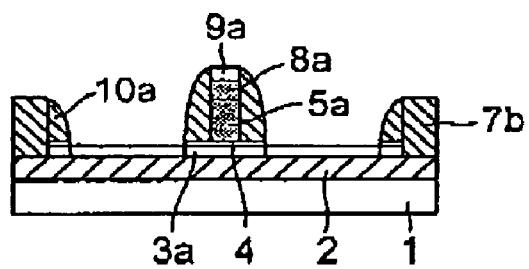
Figure 11:
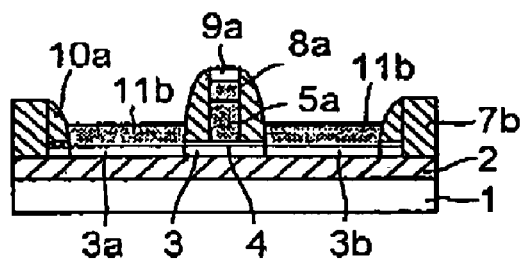
Figure 11:
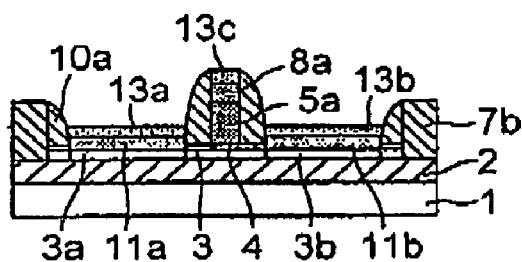
Figure 11:
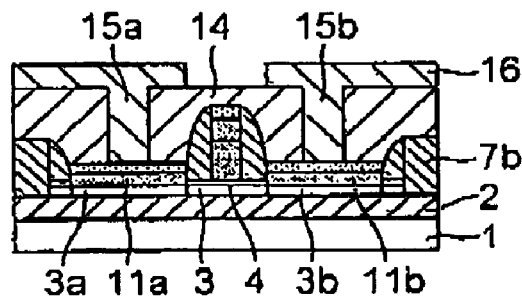

FIG. 7 is a plan view showing a third embodiment. FIG. 6(d) is a sectional view taken along the line VII-VII in FIG. 7.

As shown in FIG. 7, in the present embodiment, it is possible to form the silicide layers 13b, 13a to extend onto the element-isolation insulating films 7 when the silicide layer 13c is formed on the gate electrodes 5a, 8a, whereby contact openings for connecting the gate electrodes 5a, 8a and the metal electrode 16 can be formed on the element-isolation insulating films 7. As such, the element can be miniaturized and the resistance can be reduced.

Forth Embodiment

FIGS. 8(a) through 8(e) and FIGS. 9(a) through 9(d) are schematic sectional views showing a manufacturing method of a semiconductor device according to a forth embodiment of the present invention in the order of steps. In FIGS. 8 and 9, the dimensions in the vertical direction (up and down direction in Figs.) are shown to be enlarged.

The steps of the present embodiment shown up to FIG. 8(d) are same as that of the third embodiment shown in FIGS. 5(a) through 5(d), therefore the explanations are omitted. As shown in FIG. 8(d), explanations will be given for the manufacturing method after it is processed.

As shown in FIG. 8(e), an Al film (20) is deposited on the whole surface by spattering and is etched back (or performed chemical-mechanical polishing) so as to be selectively remained on the elevated layers 11a, 11b to thereby form a sacrifice Al film 20.

Next, as shown in FIG. 9(a), the silicon nitride film 6 on the gate electrode 5a is selectively etched away using phosphoric acid or the like, and a polycrystalline silicon film is deposited by the CVD, which is given a conductivity by ion implanting and then pattered to thereby form a second gate electrode 8b contacting the gate electrode 5a.

Next, as shown in FIG. 9(b), the sacrifice Al film 20 is etched away to thereby cause the surfaces of the elevated layers 11a, 11b to be exposed.

Then, as shown in FIG. 9(c), a silicon oxide film, for example, is deposited to have a film thickness of about 80 nm and is anisotropically etched, whereby sidewall insulating films 19 are formed on the sidewall regions of the gate electrodes 5a and 8a.

Then, cobalt, for example, is deposited by spattering on the whole surface to have a film thickness of 30 nm to 100 nm and is performed a heat treatment, to thereby form cobalt silicide layers 13a, 13b and 13c. Then, the extra cobalt is etched away, so that the cobalt silicide layers 13a, 13b and 13c are selectively remained.

Next, as shown in FIG. 9(d), an interlayer insulating film 14 and a metal electrode 16 are formed by a method same as that described in the first embodiment, then the manufacturing step of the semiconductor device according to the present embodiment is completed.

Fifth Embodiment

FIGS. 10(a) to 10(f) and FIGS. 11(a) to 11(f) are schematic sectional views showing a manufacturing method in the order of steps of a semiconductor device according to a fifth embodiment of the present invention. In FIGS. 10 and 11, the dimensions in the vertical direction (up and down direction in Figs.) are shown to be enlarged.

First, as shown in FIG. 10(a), on an SOI substrate which is so formed that a semiconductor layer (silicon layer) 3 having a film thickness of 5 nm to 60 nm is formed on a supporting substrate 1 via a buried insulating film 2, a silicon oxide film 21 is deposited to have a film thickness of about 150 nm.

Next, as shown in FIG. 10(b), the silicon oxide film 21 and the semiconductor layer 3 are selectively etched, whereby the silicon oxide film 21 and the semiconductor layer 3 in the element region are processed to be island shaped.

Then, as shown in FIG. 10(c), a silicon nitride film 7a is deposited by the CVD so as to be thicker than the total film thickness of the silicon oxide film 21 and the semiconductor layer 3.

Then, as shown in FIG. 10(d), after a predetermined amount of the silicon nitride film 7a is polished by chemical-mechanical polishing, the silicon nitride film 7a is etched by plasma etching until the silicon oxide film 21 is exposed on the surface, to thereby form element-isolation insulating films 7b, the top edge portions of which are flattened. For these element-isolation insulating films 7b, the silicon nitride film 7a is used.

Then, as shown in FIG. 10(e), the silicon oxide film 21 is etched away using fluorinated acid to thereby cause the surface of the semiconductor layer 3 to be exposed. In this step, a depression for forming elevated layers 11a, 11b described later is formed by the element-isolation insulating films 7b and the semiconductor layer 3.

Next, as shown in FIG. 10(f), a gate insulating film 4 contacting the surface of the semiconductor layer 3 is formed in the depression by a thermal oxidation, then, a first gate material layer 5 consisting of polycrystalline silicon is buried in the depression surrounding the semiconductor layer 3 by performing the CVD and chemical-mechanical polishing.

Next, as shown in FIG. 11(a), a second gate material layer 8 consisting of polycrystalline silicon is deposited using the CVD to have a film thickness of about 80 nm, then a mask insulating film 9a consisting of a silicon oxide film is formed thereon using the CVD as well.

Then, as shown in FIG. 11(b), the mask insulating film 9a, the second gate material layer 8, and the first gate material layer 5 are patterned to thereby form a first gate electrode 5a and a second gate electrode 8a.

Next, as shown in FIG. 11(c), an oxide film is deposited to have, for example, a film thickness of 150 nm using the CVD and is anisotropically etched, to thereby form sidewall insulating films 10 on the sidewalls of the gate electrodes 5a, 8a including the mask insulating film 9a and on the inner sidewalls of the element-isolation insulating films 7b, respectively.

Next, as shown in FIG. 11(d), a polycrystalline silicon film is deposited to have a film thickness of about 300 nm using the CVD and is flattened by the chemical-mechanical polishing, then the polycrystalline silicon film is etched back, whereby elevated layers 11a and 11b consisting of the polycrystalline silicon film are formed in the depressions surrounded by the element-isolation insulating films 7b and the gate electrodes.

Next, impurity atoms of a conductive type opposite to that of the channel are implanted into the second gate electrode 8a, the first gate electrode 5a and the elevated layers 11a, 11b by ion implanting and are performed a heat treatment at, for example, 1000° C. for 10 seconds. Thereby, the gate electrodes 5a, 8a and the elevated layers 11a, 11b are given conductivities while source/drain regions 3a and 3b of a conductive type opposite to that of the semiconductor layer 3 are formed.

Next, as shown in FIG. 11(e), after the mask insulating film 9a is removed (the mask insulating film 9a may be removed prior to the ion implanting step), cobalt, for example, is deposited on the whole surface by spattering to have a film thickness of 30 nm to 100 nm and is performed a heat treatment, to thereby form cobalt silicide layers 13a, 13b and 13c. Then, the extra cobalt is etched away, so that the cobalt silicide layers 13a, 13b and 13c are selectively remained. Here, the top surfaces of the elevated layers 11a, 11b and the top surface of the gate electrodes 5a, 8a have a difference in their heights. Therefore, a short circuit between them can be prevented.

Then, as shown in FIG. 11(f), an interlayer insulating film 14 consisting of, for example, an oxide film is deposited by the CVD, and the surface of which is flattened by the CMP if necessary, then the interlayer insulating film 14 is selectively etched away to thereby form contact openings 15a and 15b. Then, through deposition of a metal film and patterning by the photolithography, a metal electrode 16 contacting the silicide layer via the contact openings is formed, and the manufacturing step of the semiconductor device according to the present embodiment is completed.

Although the present invention has been described above based on the preferred embodiments, the present invention is not limited to these embodiments. The present invention can be modified at any time within a range of not deviating the subject of the present invention. For example, in the first and the third through the fifth embodiments, although the silicide layers are used for both of the elevated layers and the gate electrodes, either one or the both of them may be made solely of polycrystalline silicon. Further, although the silicide film is formed so as to reduce the resistance of the polycrystalline silicon film, a decrease in the resistance may be achieved by forming a metal film on the polycrystalline silicon film, instead of the silicide film. Moreover, although the elevated layers are buried in the depressions by performing both chemical-mechanical polishing and etching in the embodiments, it may be done only by etching.

INDUSTRIAL APPLICABILITY

As described above, in the present invention, element-isolation insulating films are formed to be thicker than a semiconductor layer which is an SOI layer, and a gate electrode is formed to be thicker than the element-isolation insulating films, and elevated layers are formed in depressions formed by the gate electrode and the element-isolation insulating films. Thereby, elevated layers which are thick and low resistance can be formed on source/drain regions without using a lithography process.

Further, in the present invention, the surface height of the gate electrode is set to be higher than the surface height of the elevated layers, whereby a short circuit between them can be effectively prevented even if a metal silicide film is formed on the elevated layers and on the gate electrode.

What is claimed is:

1. A semiconductor device comprising:
a semiconductor layer which is formed on an insulating film or on an insulating substrate while being surrounded by an element-isolation insulating film, and includes a channel region and a source/drain region;
a gate electrode which is formed on the channel region via a gate insulating film while being surrounded by a sidewall insulating film; and
an elevated layer which is made of a conductive material and is formed on the source/drain region while being surrounded by the element-isolation insulating film and the gate electrode; wherein
the elevated layer is so formed as to be buried in a depression defined by the gate electrode on which the sidewall insulating film is formed and by the element-isolation insulating film on which the sidewall insulating film is formed, while having a height different from that of the gate electrode and a surface height of the elevated layer is lower than the surface height of the element-isolation insulating film, wherein a film thickness of the elevated layer is 30 nm or less.

2. The semiconductor device, as claimed in claim 1, wherein the elevated layer comprises: a polycrystalline silicon film, or a polycrystalline silicon film and a metal silicide film formed thereon, or a polycrystalline silicon film and a metal film formed thereon, or a metal silicide film, or a metal film.

3. The semiconductor device, as claimed in claim 1, wherein a film thickness of the semiconductor layer is 30 nm or less.

4. The semiconductor device, as claimed in claim 1, wherein the gate electrode comprises: a two-layer polycrystalline silicon film, or a two-layer polycrystalline silicon film and a metal silicide film formed thereon, or a two-layer polycrystalline silicon film and a metal film formed thereon.

* * * * *

UNITED STATES PATENT AND TRADEMARK OFFICE
CERTIFICATE OF CORRECTION

PATENT NO. : 7,247,910 B2  Page 1 of 1
APPLICATION NO. : 10/499224
DATED : July 24, 2007
INVENTOR(S) : Lee et al.

It is certified that error appears in the above-identified patent and that said Letters Patent is hereby corrected as shown below:

On Title Page Item 54 and Col. 1, Line 1

The title should read:

"SEMICONDUCTOR DEVICE AND IT'S MANUFACTURING METHOD"

Signed and Sealed this

Nineteenth Day of February, 2008

JON W. DUDAS
*Director of the United States Patent and Trademark Office*